United States Patent [19]

Linder

[11] Patent Number: 4,503,340

[45] Date of Patent: Mar. 5, 1985

[54] CMOS WINDOW DETECTOR WITH HYSTERESIS

[75] Inventor: William J. Linder, Plymouth, Minn.

[73] Assignee: Honeywell Inc., Minneapolis, Minn.

[21] Appl. No.: 418,512

[22] Filed: Sep. 16, 1982

[51] Int. Cl.³ .............................................. H03K 5/153
[52] U.S. Cl. .................................... 307/360; 307/359; 307/363
[58] Field of Search ............... 307/350, 363, 359, 290, 307/360

[56]     References Cited
U.S. PATENT DOCUMENTS

| 3,609,411 | 9/1971 | Ma et al. | 307/360 |
| 3,809,926 | 5/1974 | Young | 307/360 |
| 3,984,703 | 10/1976 | Jorgensen | 307/290 |

*Primary Examiner*—John Zazworsky
*Attorney, Agent, or Firm*—Theodore F. Neils; David R. Fairbairn

[57]          ABSTRACT

A CMOS window detector provides an output signal which indicates the relationship of an input signal to a voltage "window" as a function of the previous output signal. The window detector includes first and second current source circuits and first and second inverter circuits. A bias current is established in each current source circuit as a function of a different reference voltage. The first and second inverter circuits each include a current mirror field effect transistor (FET) and a current control FET connected in a series current path. The current mirror FET of each inverter circuit is connected to its respective current source circuit and establishes a current in the inverter current path equal in magnitude to its respective bias current. The input signal is applied to the gates of the current control FETs. Each current control FET changes conductivity state when the input signal reaches the reference voltage level used to establish the respective inverter current flow. Each reference voltage therefore represents a window voltage level. The difference in window voltage levels defines the voltage window. An output circuit formed by a CMOS NAND-latch is connected to the first and second inverter circuits and provides the output signal which exhibits hysteresis with respect to the input signal.

49 Claims, 3 Drawing Figures

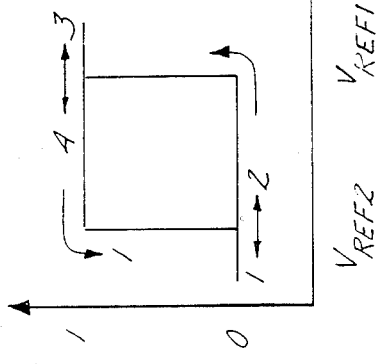

CMOS WINDOW DETECTOR WITH HYSTERESIS

REFERENCE TO COPENDING APPLICATION

Reference is hereby made to a copending application by James L. Gorecki Ser. No. 418,516, entitled "Process Insensitive CMOS Window Detector", which is filed on even date herewith and is assigned to the same assignee.

BACKGROUND OF THE INVENTION

1. Field of the Invention

The present invention relates to a voltage window detector and in particular to an integrated circuit CMOS window detector having an output exhibiting hysteresis.

2. Description of the Prior Art

A voltage window detector is a commonly used circuit element which provides outputs indicating whether an input voltage is within a "window" defined by a high and a low voltage level. The prior art includes several window detector circuits suitable for use in an integrated circuit. Nutz Pat. No. 4,184,087, Tanaka Pat. No. 4,292,552 and Dunphy et al Pat. No. 4,300,063 all describe window detectors using bipolar transistors. These circuits are implemented using many elements, and are not described as being insensitive to semiconductor process variations. All of these designs establish the threshold level of the window by means of a resistive voltage divider network.

The Dingwall Pat. No. 4,262,221 is an FET voltage comparator circuit designed for integration on a silicon-on-sapphire monolithic die. A technique for minimizing the transient offsets associated with this type of technology is described. The Musa et al Pat. No. 4,224,539 describes a FET voltage level detector which is insensitive to variations in power supply voltage.

There is a continuing need for improved integrated circuit voltage window detectors which utilize fewer components than the prior art, thus reducing area used on the integrated circuit chip and improving reliability. In addition, an integrated circuit window detector with reduced power consumption, insensitivity to semiconductor process variations, reduced temperature sensitivity, higher speed, and capability of operating with low supply voltages is needed.

SUMMARY OF THE INVENTION

The present invention is a FET voltage window detector which includes first and second supply means between which a supply voltage is provided and input means for receiving the input voltage. Bias circuit means are used to establish bias current flow between the first and second supply means. The first current mirror FET means establishes a first current flow through its source—drain current path as a function of the bias current flow. The first current control FET means is connected in a first series current path with the first current mirror FET means. The first current control FET means is connected to the input means and controls the first current flow in the first series current path. The first current control FET means changes conductive state when the input voltage reaches a first window voltage level representing one end of the desired voltage window.

In a similar manner, a second current mirror FET means establishes a second current flow as a function of bias current flow. The second current control FET means is connected in a second series current path with the second current mirror FET means. The second current control FET means is also connected to the input means and controls current flow in the second series current path. The second current control FET means changes conductive state when the input voltage reaches a second window voltage level which represents the other end of the desired voltage window.

Output means are connected to the first and second current paths. The output means provide a digital output signal indicating the relationship of the input voltage to the voltage window as a function of a previous digital output signal.

In preferred embodiments of the present invention the bias circuit is comprised of a means for providing a plurality of reference voltages and first and second current source means. The first current source means establishes a first bias current flow and is formed by first and second bias current FETs connected in a series current path between the supply means. The second current source means establishes a second bias current flow and is similarly formed by third and fourth bias current FETs.

The first current flow is established in the first series current path as a function of the first bias current flow and a ratio of channel shape factors of the second bias current FET means and the first current mirror FET means. Similarly, the second current flow is established in the second series current path as a function of the second bias current flow and a ratio of the channel shape factors of the fourth bias current FET means and the second current mirror FET means.

The output means is further comprised of a NAND-latch formed by first and second NAND logic gates. This output means provides an output signal exhibiting hysteresis with respect to the input signal. The NAND-latch switches from a first state to to a second state if the digital output signal was previously in the first state and the input signal increases to a voltage level greater than the first reference voltage level. The NAND-latch switches from the second state to the first state if the digital output signal was previously in the second state and the input signal decreases to a level less than the second reference voltage level.

BRIEF DESCRIPTION OF THE DRAWINGS

FIG. 2 is a table listing the states of the individual FETs comprising the NAND logic gates of the present invention for four possible input signal conditions.

FIG. 3 is a graphical representation of the input-output characteristics of the window detector of the present invention.

DETAILED DESCRIPTION OF THE PREFERRED EMBODIMENTS

Figure 1:
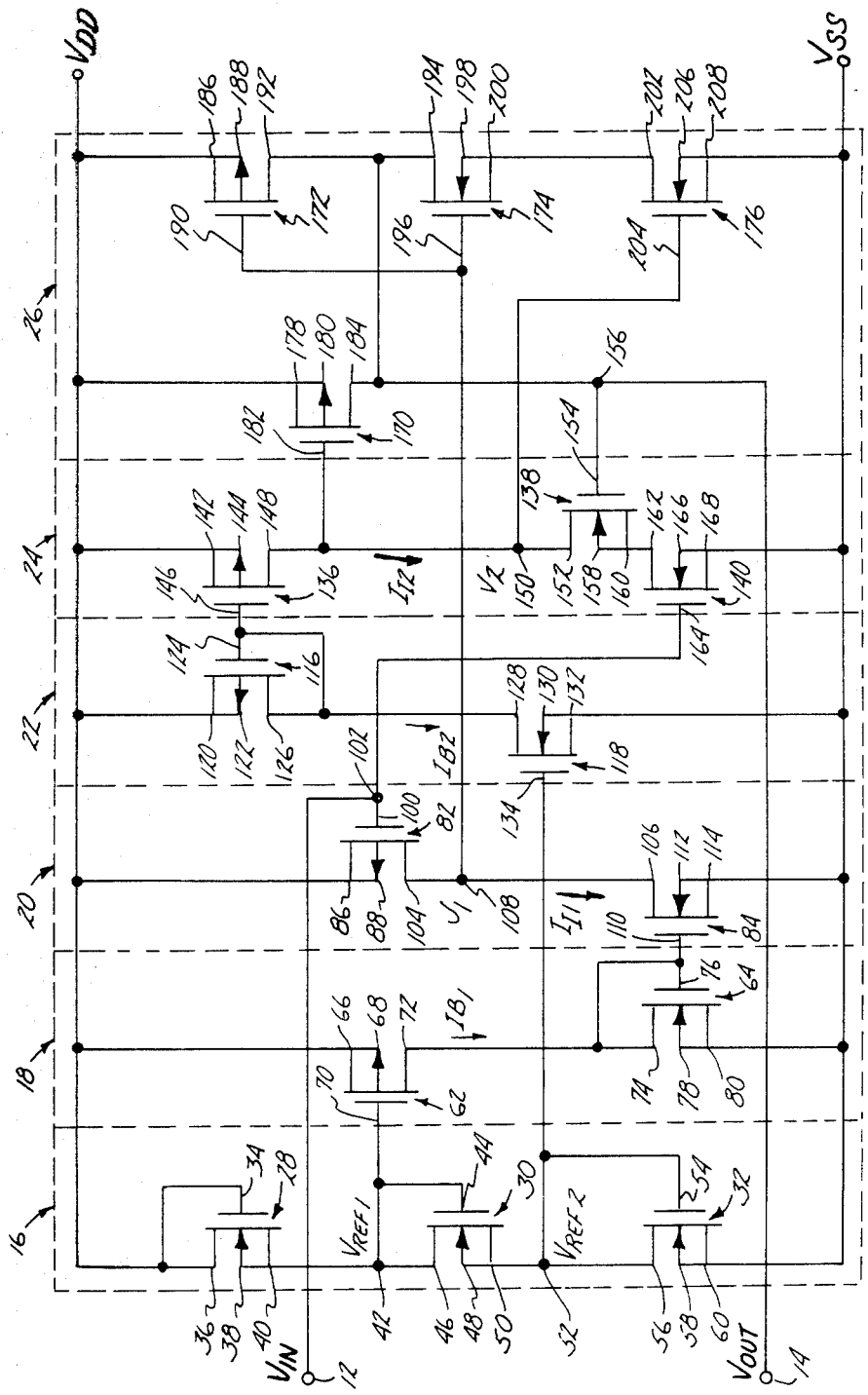
FIG. 1 is a schematic drawing of the window detector with hysteresis of the present invention.

A preferred embodiment of window detector 10 of the present invention is illustrated in FIG. 1. This particular embodiment is fabricated using P-tub, metal gate CMOS technology, although the present invention is applicable to other complementary FET integrated circuit technologies as well.

Window detector 10 includes six interconnected circuit elements between a relatively positive voltage supply $V_{DD}$ and a relatively negative voltage supply $V_{SS}$. Input signal $V_{IN}$ is applied to window detector 10 at input terminal 12. A digital output signal, $V_{OUT}$, indicating whether the input signal is within or outside a predetermined voltage window as a function of a previous digital output signal is provided at output terminal 14.

Voltage reference circuit 16 functions as a voltage divider and establishes two reference voltages, $V_{ref1}$ and $V_{ref2}$. First current source circuit 18 operates to produce a voltage-to-current conversion. A first bias current $I_{b1}$ is produced in a series current path of first current source circuit 18 as a function of the first reference voltage $V_{ref1}$. First inverter circuit 20 operates to produce a current-to-voltage conversion. The bias current, $I_{B1}$, established in first current source circuit 18, $I_{B1}$, is mirrored into first inverter circuit 20. The current in first inverter circuit 20, $I_{I1}$ is then controlled as a function of the input signal. Second current source circuit 22, like first current source circuit 16, produces a voltage-to-current conversion. A second bias current $I_{B2}$ is established in a series current path of second current source circuit 22 as a function of the second reference voltage $V_{ref2}$. Like first inverter circuit 20, second inverter/NAND gate circuit 24 produces a current-to-voltage conversion. The second bias current $I_{B2}$ is mirrored into a series current path of second inverter/NAND gate circuit 24 and this current, $I_{I2}$, controlled as a function of the input signal.

The magnitude of the current flow $I_{I1}$, $I_{I2}$ in each inverter circuit 20, 24 is determined by the input signal. The voltage level in each inverter circuit 20, 24 therefore represents the relationship of the input signal $V_{IN}$ to one of two window voltage levels $V_H$, $V_L$ which together represent the desired window voltage range. Second inverter/NAND gate circuit 24 and first NAND gate circuit 26 are interconnected to form a NAND-latch. The NAND gates of second inverter/NAND gate circuit 24 and first NAND gate circuit 26 are connected to the two inverter circuits 24, 20. Output terminal 14 of the NAND-latch indicates the relationship of the input signal to the voltage window as a function of the previous digital output signal of the NAND-latch.

The operation of window detector 10 is determined to a large extent by the operating characteristics of the individual field effect transistors of the circuit. A brief description of FET operating characteristics will therefore be useful.

Current flow through an N-channel FET operating within its saturation region is described by the following equation:

$$I_D = \frac{\beta S}{2} (V_{GS} - V_T)^2 \cdot \text{N-channel FET} \quad \text{Eq. 1}$$

Current flow through a P-channel FET operating in its saturation region is described by a similar equation:

$$I_D = \frac{\beta S}{2} (V_T - V_{GS})^2 \cdot \text{P-channel FET} \quad \text{Eq. 2}$$

$\beta$ is the gain of the FET in amperes/volt$^2$. This parameter is often seen in the alternate form:

$$\beta = \mu_o C_{OX} \quad \text{Eq. 3}$$

The mobility, $\mu_o$, refers to the ability of electrons (or holes) to flow through the channel of the FET. $C_{OX}$ represents the capacitance of the oxide layer separating the gate and channel of the FET.

The gain $\beta$ of the FET is a physical constant determined by the process used to fabricate the FET. All FETs of a given channel conductivity type on an integrated circuit will have nearly identical $\beta$ values. $\beta$ values from chip to chip of a given batch of integrated circuits are also typically within close tolerances.

S is the shape factor of an individual FET, and is a ratio of channel width to channel length. Shape factor S is determined by the size of the mask used in fabrication of the FET.

$$S = W/L. \quad \text{Eq. 4}$$

$V_{GS}$ is the voltage potential applied across the gate-to-source terminals of the FET. $V_T$ is the threshold voltage of the FET. The threshold voltage $V_T$ of an FET, like $\beta$, is a physical constant determined by the process used to fabricate the device. All FETs of a particular channel conductivity type on a single chip will have nearly identical threshold voltage $V_T$. Tolerances from chip-to-chip using the same process also are very close. Nominal values of $V_T$ are $0.6 \pm 0.3$ volts. The variation ($\pm 0.3$ volts) reflects the difference in process specifications and not the variation across the chip or from chip-to-chip formed using the same process. Threshold voltage variation of less than one percent across a particular integrated circuit chip is typical.

The quantities ($V_{GS} - V_T$) and ($V_T - V_{GS}$) are commonly known as the excess voltage, as it is actually the amount of voltage with which the FET is turned on. To make the N-channel enhancement mode FET of Equation 1 conductive, $V_{GS}$ must be a positive quantity. This means the gate must be at a relatively positive potential with respect to the source. Under this convention $V_T$ is also a positive quantity for the N-channel enhancement mode device. $V_{GS}$ must therefore be greater than $V_T$ to produce an excess voltage and form a conductive channel in a N-channel enhancement mode FET.

The P-channel enhancement mode FET described by Equation 2 requires a negative $V_{GS}$ in order to become conductive. This means the gate must be at a relatively negative voltage potential with respect to the source. $V_T$ is also a negative quantity for the P-channel enhancement mode FET under this convention. $V_{GS}$ must therefore be more negative than $V_T$ in order for the quantity ($V_T - V_{GS}$) to become positive, produce an excess voltage, and make the channel of the P-channel FET conductive. Drain current flow through N-channel and P-channel enhancement mode FETs is therefore directly proportional to shape factor S and gain $\beta$ and proportional to the square of the excess voltage.

Voltage reference circuit 16, first current source circuit 18, and second current source circuit 22 together comprise a bias circuit for window detector 10. Voltage reference circuit 16 is formed by identical enhancement mode N-channel FETs 28, 30 and 32. FET 28 has its gate 34 and drain 36 connected to the relatively positive supply $V_{DD}$. Substrate 38 and source 40 of FET 28 are connected to node 42. FET 30 also has its gate 44 and drain 46 connected to node 42. Substrate 48 and source 50 of FET 30 are connected to node 52. Gate 54 and drain 56 of FET 32 are also connected to node 52. Substrate 58 and source 60 of FET 32 are connected to the relatively negative supply $V_{SS}$.

FETs 28, 30 and 32 of voltage reference circuit 16 are identical devices, all having the same shape factor S and gain $\beta$. These FETs all operate in the saturation region and all conduct identical drain current $I_D$ as described by Equation 1. FETs 28, 30 and 32 function as a voltage divider and establish a first and second reference voltage $V_{ref1}$ and $V_{ref2}$. Since FETs 28, 30 and 32 of voltage reference circuit 16 all conduct identical drain current $I_D$ and have the same threshold voltage $V_T$, each has an identical source-to-drain voltage drop. The first reference voltage $V_{ref1}$ established at node 42 therefore is found to be:

$$V_{ref1} = \tfrac{2}{3}(V_{DD} - V_{SS}). \qquad \text{Eq. 5}$$

The second reference voltage $V_{ref2}$ established at node 52 is:

$$V_{ref2} = \tfrac{1}{3}(V_{DD} - V_{SS}). \qquad \text{Eq. 6}$$

In the preferred embodiment of window detector 10 $V_{SS} = 0$, therefore:

$$V_{ref1} = \tfrac{2}{3} V_{DD}. \qquad \text{Eq. 7}$$

$$V_{ref2} = \tfrac{1}{3} V_{DD}. \qquad \text{Eq. 8}$$

First current source circuit 18 of window detector 10 is formed by enhancment mode P-channel FET 62 and enhancement mode N-channel FET 64. FET 62 has its source 66 and substrate 68 connected to receive the relatively positive suppl $V_{DD}$. Gate 70 of FET 62 is connected to node 42. Drain 72 of FET 62 is connected to drain 74 and gate 76 of FET 64. FET 64 has its substrate 78 and source 80 connected to the relatively negative supply $V_{SS}$. A first bias current $I_{B1}$ is established in first current source circuit 18 by first bias current FET 62. First bias current $I_{b1}$ is determined as a function of first reference voltage $V_{ref1}$. Magnitude of the first bias current $I_{b1}$ is found using Equation 9:

$$I_{B1} = \frac{\beta_p S_{62}}{2}(V_{TP} - V_{GS})^2. \qquad \text{Eq. 9}$$

$S_{62}$ is the shape factor of FET 62. $V_{TP}$ and $\beta_P$ are the threshold voltage and gain of P-channel FETs of the integrated circuit window detector 10. Gate 70 of first bias current FET 62 is connected to node 42 to receive the first reference voltage $V_{ref1}$. This represents the gate-to-drain voltage potential across the device. The gate-to-source voltage, $V_{GS}$, of bias current FET 62 is therefore found to be:

$$V_{GS} = -(V_{DD} - V_{ref1}). \qquad \text{Eq. 10}$$

$$V_{GS} = -\tfrac{1}{3} V_{DD} \qquad \text{Eq. 11}$$

Equation 9 describing the first bias current flow $I_{B1}$ through first current source circuit 18 then takes the form:

$$I_{B1} = \frac{\beta_p S_{62}}{2}(V_{TP} + \tfrac{1}{3} V_{DD}) \qquad \text{Eq. 12}$$

First inverter circuit 20 is formed by enhancement mode P-channel FET 82 and enhancement mode N-channel FET 84. Source 86 and substrate 88 of FET 82 are connected to the relatively positive supply $V_{DD}$. FET 82 has its gate 100 connected to node 102 to receive the input signal $V_{IN}$. Drains 104 of FET 82 and 106 of FET 84 are connected to node 108. FET 84 has its gate 110 connected to gate 76 of FET 64. Substrate 112 and source 114 of FET 84 are connected to the relatively negative supply $V_{SS}$.

FET 84 of first inverter circuit 20 functions as a first current mirror FET. In the preferred embodiment of the present invention, first current mirror FET 84 and second bias current FET 64 have identical gain $\beta$ and shape factor S. Since FETs 84 and 64 have their gates connected together and their sources connected to $V_{SS}$, both have identical gate-to-source voltage $V_{GS}$. The first bias current $I_{b1}$ is therefore mirrored into first inverter circuit 20. A first inverter current $I_{I1}$, of magnitude equal to $I_{b1}$ is established in first inverter circuit 20.

$$I_{I1} = I_{B1} \qquad \text{Eq. 13}$$

FET 82 of first inverter circuit 20 is a current control device. Current control FET 82 is a P-channel device operating within its saturation region so its current flow is described by Equation 2. Since the gain $\beta_p$ of FET 82 is large, typically within the range of 31 to 100, and $I_D$ is proportional to the square of the excess voltage, a very narrow range of gate-to-source voltage $V_{GS}$ will cause the FET to pass from a low conductivity state with little or no drain current flow, to a high conductivity state with a large drain current flow. Current control FET 82, therefore, effectively operates as a switch and controls the flow of the first inverter current $I_{I1}$ which was established in first inverter circuit 20 by current mirror FET 84.

Current control FET 82 performs a current-to-voltage conversion. First inverter current $I_{I1}$ is converted by current control FET 82 into a voltage level. This voltage defines the high window voltage level of the window voltage range and is designated $V_H$. The gate-to-source voltage $V_{GS}$ needed for current control FET 82 to change conductivity state is found by setting the first inverter current $I_{I1}$ equal to Equation 2 which describes the current flow through current control FET 82. The resulting equation is solved for $V_{GS}$. This parameter represents the high window voltage level $V_H$.

$$\frac{\beta_p S_{62}}{2}(V_{TP} + \tfrac{1}{3} V_{DD})^2 = \frac{\beta_p S_{82}}{2}(V_{TP} - V_{GS})^2 \qquad \text{Eq. 14}$$

$$V_{GS} = V_{TP} - \sqrt{\frac{2\beta_p S_{62}}{2\beta_p S_{82}}(V_{TP} + \tfrac{1}{3} V_{DD})^2} \qquad \text{Eq. 15}$$

In the preferred embodiment of window detector 10 $S_{62} = S_{82}$. Therefore:

$$V_{GS} = V_{TP} - (V_{TP} + \tfrac{1}{3} V_{DD}) \qquad \text{Eq. 16}$$

$$V_{GS} = -\tfrac{1}{3} V_{DD} \qquad \text{Eq. 17}$$

Current control FET 82 of first inverter circuit 20 therefore changes conductivity state when its gate-to-source voltage $V_{GS}$ reaches a level of $-\tfrac{1}{3} V_{DD}$. It should be noted that this $V_{GS}$ is the same gate-to-source voltage which was applied to first bias current FET 62 of first inverter circuit 18. The high window voltage level $V_H$ (i.e. the "trip point" of FET 82) is therefore made equal to the first reference voltage level $V_{ref1}$ due to the circuit geometry.

When the input signal $V_{IN}$ applied to input terminal 12 is less than the first reference voltage $V_{ref1}$, current control FET 82 will be in its high conductivity state with the first inverter current $I_{I1}$ flowing through first inverter circuit 20. The voltage potential $V_1$ at node 108 will then be drawn toward the relatively positive supply $V_{DD}$. As the input signal $V_{IN}$ increases to a level above the first reference voltage $V_{ref1}$, current control FET 82 changes to a low conductivity state and effectively appears as an open circuit with very little current flowing through its source-to-drain current path. The voltage potential $V_1$ at node 108 is then drawn toward the relatively negative supply $V_{SS}$.

Second current source circuit 22 and second inverter/NAND gate circuit 24 function together in a manner very similar to first current source circuit 18 and first inverter circuit 20. Second current source circuit 22 is formed by enhancement mode P-channel FET 116 and enhancement mode N-channel FET 118. Source 120 and substrate 122 of FET 116 are connected to the relatively positive supply $V_{DD}$. Gate 124 and drain 126 of FET 116 are connected to drain 128 of FET 118. Substrate 130 and source 132 of FET 118 are connected to the relatively negative supply $V_{SS}$. FET 118 has its gate 134 connected to node 52 to receive the second reference voltage $V_{ref2}$.

A second bias current $I_{B2}$ is established in second current source circuit 22 by third bias current FET 118 as a function of $V_{ref2}$. The second bias current $I_{B2}$ is found by Equation 1 to be:

$$I_{B2} = \frac{\beta_N S_{118}}{2} (V_{GS} - V_{TN})^2 \qquad \text{Eq. 18}$$

$\beta_N$ is the gain and $V_{TN}$ the threshold voltage of N-channel FET in the integrated circuit of window detector 10. $S_{118}$ is the shape factor of FET 118. The gate of FET 118 is connected to node 52 to receive the second reference voltage $V_{ref2}$. Its gate-to-source voltage $V_{GS}$ of third bias current FET$_{118}$ is then found to be:

$$V_{GS} = \tfrac{1}{3} V_{DD} \qquad \text{Eq. 19}$$

Equation 18, which describes the second bias current $I_{B2}$ flowing through second current source circuit 22 then takes the form:

$$I_{B2} = \frac{\beta_N S_{118}}{2} (\tfrac{1}{3} V_{DD} - V_{TN})^2 \qquad \text{Eq. 20}$$

Second inverter/NAND gate circuit 24 is formed by enhancement mode P-channel FET 136, enhancement mode N-channel FET 138 and enhancement mode N-channel FET 140. Source 142 and substrate 144 of FET 136 are connected to the relatively positive supply $V_{DD}$. Gate 146 of FET 136 is connected to gate 124 of FET 116. FET 136 has its drain 148 connected to node 150. Drain 152 of FET 138 is also connected to node 150. Gate 154 of FET 138 is connected to node 156. FET 138 has its substrate 158 and source 160 connected to drain 162 of FET 140. Gate 164 of FET 140 is connected to node 102 to receive the input signal $V_{IN}$ through input terminal 12. Substrate 166 and source 168 of FET 140 are connected to the relatively negative supply $V_{SS}$.

For purposes of describing the inverter action of second inverter/NAND gate circuit 24, FET 138 may be treated as if it were not present in the circuit and its source-to-drain path replaced by a short circuit. FET 136 functions as a second current mirror. Second current mirror FET 136 and fourth bias current FET 116 have identical shape factor S and gain $\beta$ and gate-to-source voltage $V_{GS}$. The second bias current $I_{B2}$ is therefore mirrored into second inverter/NAND gate circuit 24 and a second inverter current $I_{I2}$ of a magnitude equal to $I_{B2}$ established.

$$I_{I2} = I_{B2} \qquad \text{Eq. 21}$$

FET 140 of second inverter/NAND gate circuit 24 is a N-channel device operating within its saturation region. It controls flow of the second inverter NAND/-gate current $I_{I2}$ through the second inverter/NAND gate circuit 24. Current control FET 140 will change from its low conductivity state to its high conductivity state over a very narrow range of voltage $V_{GS}$ in much the same manner as first current control FET 82 previously described. Second current control FET 140 also functions as a current-to-voltage conversion device. Second inverter/NAND gate current $I_{I2}$ is converted into a voltage $V_L$ defining the low window voltage level of the window voltage range. The gate-to-source voltage $V_{GS}$ at which current control FET 140 changes conductivity states (i.e. the trip point) is found by setting the second inverter/NAND gate current $I_{I2}$ equal to Equation 1.

$$\frac{\beta_N S_{118}}{2} (\tfrac{1}{3} V_{DD} - V_{TN})^2 = \frac{\beta_N S_{140}}{2} (V_{GS} - V_{TN})^2 \qquad \text{Eq. 22}$$

$$V_{GS} = V_{TN} + \sqrt{\frac{2\beta_N S_{118}}{2\beta_N S_{140}} (\tfrac{1}{3} V_{DD} - V_{TN})^2} \qquad \text{Eq. 23}$$

In the preferred embodiment of the present invention $S_{118} = S_{140}$. Therefore:

$$V_{GS} = V_{TN} + (\tfrac{1}{3} V_{DD} - V_{TN}) \qquad \text{Eq. 24}$$

$$V_{GS} = \tfrac{1}{3} V_{DD} \qquad \text{Eq. 25}$$

Current control FET 140 therefore changes conductivity state when the input signal reaches a voltage level of $\tfrac{1}{3} V_{DD}$. This is the same voltage ($V_{ref2}$) with which the second bias current $I_{B2}$ was established in second current source circuit 22. The low window voltage level (i.e. the "trip point" of FET 140) is therefore made equal the second reference voltage level $V_{ref2}$ due to the circuit geometry.

When the input signal $V_{IN}$ applied to input terminal 12 is lower than the second reference voltage $V_{ref2}$, current control FET 140 will be in its low conductivity state and its source-to-drain current path effectively appears as an open circuit with very little current. The voltage potential $V_2$ at node 150 will therefore be drawn toward the relatively positive supply $V_{DD}$. As the input signal $V_{IN}$ increases beyond the low window voltage level $V_L$, current control FET 140 changes to a high conductivity state and allows the second inverter/-NAND gate current $I_{I2}$ to flow through its drain-to-source current path. The voltage potential $V_2$ at node 150 is then drawn toward the relatively negative supply $V_{SS}$.

It has been shown that the window voltage levels $V_L$ and $V_H$ of the present invention are determined solely by first and second reference voltages $V_{ref1}$ and $V_{ref2}$, respectively. Window voltage range $\Delta V$ of window detector 10 is determined by the difference between the high and low window voltage levels.

$$\Delta V = V_H - V_L \qquad \text{Eq. 26}$$

Because of the geometry of the current source and inverter circuits, the window voltage levels $V_L$ and $V_H$, (and therefore the window voltage range $\Delta V$) are independent of all process variations. In particular, it should be noted that the window voltage range is not dependent on the gain $\beta$ or threshold voltage $V_T$ of the individual FETs. This is a very desirable and advantageous result, since the window voltage range $\Delta V$ is also independent of any temperature variation of $\beta$ and $V_T$ as well.

The supply voltage range of the present invention was divided into thirds with the center portion of the range used as the window voltage range $\Delta V$. Those skilled in the art will realize that the supply voltage range can be divided into other increments using a greater or lesser number of FETs. Other portions of this range can likewise be used as the window voltage range $\Delta V$.

Window detector 10 of the present invention does not merely provide an output signal indication of whether or not the input signal $V_{IN}$ is within the window voltage range $\Delta V$, but rather provides this output signal with hysteresis. An output exhibiting hysteresis is one which is combinational for some inputs (i.e. determined simply as a function of the inputs) and works as a memory device for other inputs. The output signal is therefore determined as a function of the input signal and a previous output signal. To provide an output signal exhibiting hysteresis, the present invention has a NAND-latch logic element connected to the first and second inverter circuits. The NAND-latch is formed by interconnecting two individual NAND logic gates.

First NAND logic gate 26 is formed by enhancement mode P-channel FETs 170 and 172 and enhancement mode N-channel FETs 174 and 176. Source 178 and substrate 180 of FET 170 are connected to the relatively positive supply $V_{DD}$. Gate 182 of FET 170 is connected to second inverter/NAND gate circuit 24 at node 150. Drain 184 of FET 170 is connected to node 156. FET 172 has its source 186 and substrate 188 connected to the relatively positive supply $V_{DD}$. Gate 190 of FET 172 is connected to first inverter circuit 20 at node 108. Drain 192 of FET 172 is connected to drain 184 of FET 170. FET 174 has its drain 194 connected to drain 192 of FET 172 while gate 196 of FET 174 is connected to gate 190 of FET 172. Substrate 198 and source 200 of FET 174 are connected to drain 202 of FET 176. Gate 204 of FET 176 is connected to gate 182 of FET 172 at node 150. Substrate 206 and source 208 of FET 174 are connected to the relatively negative supply $V_{SS}$.

The second NAND logic gate is formed by second inverter/NAND gate circuit 24 already described. This is one of the unique aspects of the present invention. With the addition of FET 138 to the inverter circuit comprised of FETs 136 and 140 a NAND logic gate is formed.

There are three possible relationships between the input signal $V_{IN}$ and the voltage window $\Delta V$: (1) $V_{IN}$ is below the window, i.e. $V_{IN}$ less than $V_L$; (2) $V_{IN}$ is within the window, i.e. $V_L$ less than $V_{IN}$ less than $V_H$; and (3) $V_{IN}$ is above the window, i.e. $V_{IN}$ greater than $V_H$. Depending upon which relationship exists, and the previous state of the digital output signal $V_{OUT}$, the one bit binary code of logic output 14 is different.

FIG. 2 is a table which describes the overall operation of window detector 10 for each of these inputs as a function of the previous digital output signal. FIG. 3 is a graphical representation of the input-output characteristics of window detector 10.

For purposes of describing the logic gate operation of second inverter/NAND gate circuit 24, the input signal $V_{IN}$ applied to gate 164 of FET 140 and the previous output signal $V_{OUT}$ applied to gate 154 of FET 138 are used as inputs. Voltage $V_2$ at node 150 represents an output of second inverter/NAND gate circuit 24.

Voltage $V_2$ at node 150 is an input to first NAND gate circuit 26 along with voltage $V_{f1}$ at node 108. The output signal $V_{OUT}$ taken from node 156 is the output of first NAND gate circut 156 as well as the output of window detector 10.

Row 1 of FIG. 2 describes the operation of the window detector 10 when the input signal $V_{IN}$ applied to input terminal 12 is below the low window voltage level $V_L = V_{ref2} = \frac{1}{3} V_{DD}$. With this input current control FET 140 of second inverter/NAND gate circuit 24 is in a low conductivity state ("off"). Voltage $V_2$ at node 150 is then at a high potential. First current control FET 82 of first inverter circuit 20 is in its high conductivity state ("on") and voltage $V_1$ at node 108 is also at a high potential. P-channel FETs 170 and 172 of first NAND gate circuit 26, both having a high voltage potential applied to respective gates 182 and 190, are "off". N-channel FETs 174 and 176 of first NAND gate circuit 126, both have a high voltage potential applied to respective gates 196 and 204 therefore are "on". Node 156 and therefore output terminal 14 are at a low voltage potential. Since FET 138 has the low voltage potential at node 156 applied to its gate it also is "off". Logic output terminal 14 therefore always indicates a "low" or "0" logic level when the input signal is less than the second voltage reference level $V_{ref2}$, (i.e. the low window voltage level $V_L$).

Row 2 of FIG. 2 illustrates the operation of window detector 10 when the output signal is already in its "low" or "0" logic state and the input signal increases from a level below the second reference voltage $V_{ref2}$ to a level above the second reference voltage. Since the input signal is now within the window voltage range $\Delta V$ and greater than the second reference voltage $V_{ref2}$, current control FET 140 is in its high conductivity state ("on"). N-channel FET 138 is still off since the low voltage potential of the previous digital output signal is applied to its gate 154 through node 156. Voltage $V_2$ at node 150 is therefore still at a high voltage potential. First current control FET 82 is still in its high conductivity state ("on") since the input signal has not reached the first reference voltage level $V_{ref1}$, and $V_1$ at node 108 is therefore still at a high potential. The states of FETs 170, 172, 174 and 176 of first NAND gate circuit 126 are therefore unchanged. The digital output signal at output terminal 14 therefore remains at a "low" or "0" logic level if the previous digital output signal was at a "low" or "0" logic level and the input signal increases from a level below to a level above the second reference voltage level $V_{ref2} = \frac{1}{3} V_{DD}$.

As shown in FIGS. 2 and 3, the transition between "row 1" and "row 2" conditions is reversible, without a change in state of $V_{OUT}$. As long as $V_{IN}$ remains below $V_{ref1}$, so that a transition from "row 2" to "row 3" does not occur, $V_{OUT}$ remains "0".

Row 3 of FIG. 2 illustrates the operation of window detector 10 when the input signal increases to a level greater than the first reference voltage level $V_{ref1} = \frac{2}{3} V_{DD}$ when the previous digital output signal was in a "low" or "0" logic state. Since the input signal is now greater than the first reference voltage $V_{ref1}$, current control FET 82 of first inverter circuit 20 is in its low conductivity state ("off"). Voltage $V_1$ at node 108 is therefore at a low potential. P-channel FET 172 of first NAND gate circuit 26 therefore switches "on" while N-channel FET 174 of the same circuit switches "off". With P-channel FET 172 now "on", the voltage at node 156 and therefore output terminal 14, is at a "high" or "1" logic level. N-channel FET 138 of second inverter/NAND gate circuit 24 now has a high voltage potential applied to its gate 154 and is therefore turned on. Since the second current control FET 140 was already on, the current $I_{I2}$ now flows through the second inverter/NAND gate circuit 24. Voltage $V_2$ at node 150 is therefore at a low voltage potential. FET 176 of first NAND gate circuit 26 switches to its "off" state while P-channel FET 170 switches to its "on" state. The transition is then complete. The digital output signal taken from terminal 14 therefore switches from a "low" or "0" logical level to a "high" or "1" logic level if the digital output signal was previously in the "low" or "0" logic state and the input signal has increased to a voltage greater than the first reference voltage $V_{ref1}$. Row 3 of FIG. 2 also illustrates the operation of the window detector 10 if the digital output signal is already in a "high" or "1" logic state and the input signal increases to any level greater than the first reference voltage $V_{ref1}$.

Row 4 of FIG. 2 illustrates the operation of window detector 10 when the input signal $V_{IN}$ decreases from a level greater than to a level less than $V_{ref1}$ while still remaining greater than the second reference voltage level $V_{ref2}$. The input signal $V_{IN}$ is now within the window voltage range $\Delta V$ with the previous digital output signal $V_{OUT}$ at terminal 14 at a "high" or "1" logic state. Since the input signal $V_{IN}$ is now less than the first reference voltage level $V_{ref1}$, current control FET 82 has changed back to its high conductivity state ("on") drawing voltage $V_1$ at node 108 to a high potential. P-channel FET 172 of first NAND gate 26 therefore switches back to its "off" state while N-channel FET 174 switches back to its "on" state. Second current control FET 140 of second inverter/NAND gate circuit 24 is still in its high conductivity state ("on") since the input signal applied to its gate 164 is greater than the second reference voltage level $V_{ref2}$. FET 138 of second inverter/NAND gate circuit 24 is "on" as the voltage applied to its gate 154 from node 156 is at a high potential. N-channel FET 176 of first NAND gate circuit 26 therefore remains "off" while P-channel FET 170 remains "on". The digital output signal $V_{OUT}$ at output terminal 14 therefore remains at its "high" or "1" logic level state. The digital output signal $V_{OUT}$ of window detector 10 is therefore in a "high" or "1" logic level state when the digital output signal $V_{OUT}$ was previously at its "high" or "1" logic state and the input signal is at any voltage greater than the second reference voltage $V_{ref2}$.

As shown in FIGS. 2 and 3, the transition between "row 3" and "row 4" conditions is reversible without a change in state of $V_{OUT}$, so that a transition from "row 4" to "row 1" does not occur, $V_{OUT}$ remains "1".

Row 1 of FIG. 2 illustrates the operation of window detector 10 when the digital output signal $V_{OUT}$ at output terminal 14 is at a "high" or "1" logic level state when the input signal $V_{IN}$ applied to input terminal 12 decreases to a level less than the second reference voltage $V_{ref2}$. Since the signal applied to gate 164 of second current control FET 140 is now less than the second reference voltage $V_{ref2}$ second current control FET 140 changes to its low conductivity state ("off"). Voltage $V_2$ at node 150 therefore is drawn to a high potential. N-channel FET 176 then switches "on", while P-channel FET 170 switches "off". First current control FET 82 is still in its high conductivity state ("on") since the input signal $V_{IN}$ is less than the first reference voltage $V_{ref1}$. Voltage $V_1$ at node 108 is therefore at a high potential and the states of N-channel FET 174 and P-channel FET 172 remain unchanged. The voltage at node 156 has therefore changed to a low potential and as a result the output signal $V_{OUT}$ at output terminal 14 switches to a "low" or "0" logic level. FET 138 switches "off" to complete the transition putting the circuit of window detector 10 in the same state as described previously with respect to row 1.

The operation of window detector 10 may be summarized as follows: If the output signal $V_{OUT}$ at output terminal 14 is in its "low" or "0" logic level state, it remains in its "low" or "0" logic level state until the input signal $V_{IN}$ applied to input terminal 12 increases to a level greater than the first reference voltage $V_{ref1}$. At this point the output signal $V_{OUT}$ at output terminal 14 switches to a "high" or "1" logic level state. The digital output signal $V_{OUT}$ at output terminal 14 will remains in its "high" or "1" logic level state for any input signal $V_{IN}$ applied to terminal 12 which is greater than the second reference voltage $V_{ref2}$. Only when the input signal $V_{IN}$ applied to input terminal 12 decreases to a level less than the second reference voltage $V_{ref2}$ does the digital output signal $V_{OUT}$ at output terminal 14 switch back to its "low" or "0" logic level state and complete the input-output cycle.

Using a small number of additional FETs (four in first NAND gate circuit 26 and one in second inverter/NAND gate circuit 24), the window detector has been converted to a window detector with hysteresis. This particular circuit is designed to detect the locked state of a phase locked loop (PLL). The circuit is, of course, well suited for any application where some method of noise reduction is needed or where a Schmitt Trigger might otherwise be used.

In conclusion, the CMOS window detector with hysteresis of the present invention provide a means for determining whether the input signal $V_{IN}$ is within a predetermined voltage window as a function of the previous digital output signal. Window detector 10 uses very few components and is capable of being fully integrated. Performance is independent of all process variation. The window voltage levels are determined by physical constants (shape factors of the FETs) used in fabrication.

The window detector of the present invention has other important advantages as well. First, the speed of the window detector of the present invention is higher than the prior art implementations which use complete integrated circuit comparators. Second, the present invention uses fewer components, thus requiring less area on an integrated circuit chip. Third, the window detector of the present invention is capable of operation with very low supply voltages (e.g. as low as 2.5 volts).

Although the present invention has been described with reference to preferred embodiments, workers skilled in the art will recognize that changes may be made in form and detail without departing from the spirit and scope of the invention. In particular, it should be noted that although the specific preferred embodiment described uses P-tub metal gate CMOS technology, the present invention can be fabricated in complementary form (i.e. N-tub CMOS technology), using metal gate CMOS technology, or using other FET integrated circuit technologies such as JFET technology.

What is claimed is:

1. A field effect transistor (FET) integrated circuit window detector for comparing an input voltage with first and second voltage levels representing a desired voltage window, the circuit comprising:

input means for receiving the input voltage;

first and second supply means adapted to receive first and second supply voltage levels, respectively;

bias circuit means for establishing bias current flow between the first and second supply means;

first current mirror FET means having a channel, a gate, a source, and a drain, the first current mirror FET means being connected to the bias circuit means so that a first current flow through the source-drain current path of the first current mirror FET means is established as a function of bias current flow;

first current control FET means having a channel, a gate, a source and a drain, the source and drain of the first current control FET means being connected in a first series current path with the source and drain of the first current mirror FET means between the first and second supply means, and the gate of the first current control FET means being connected to the input means to receive the input voltage; so that when the input voltage attains a first voltage level, current flow through the source-drain current path of the first current control FET means changes;

second current mirror FET means having a channel, a gate, a source, and a drain, the second current mirror FET means being connected to the bias circuit means so that a second current flow through the source-drain current path of the second current mirror FET means is established as a function of bias current flow;

second current control FET means having a channel, a gate, a source and a drain, the source and drain of the second current control FET means being connected in a second series current path with the source and drain of the second current mirror FET means between the first and second supply means, and the gate of the second current control FET means being connected to the input means to receive the input voltage, so that when the input voltage attains a second voltage level current flow through the source-drain current path of the second current control FET means changes; and output means connected to the first and second current paths for providing a digital output signal exhibiting hysteresis with respect to the input voltage, the digital output signal switching from a first state to a second state if the digital output signal was previously in the first state and the input voltage increases to a value greater than the first voltage level, and switching from the second state to the first state if the digital output signal was previously in the second state and the input voltage decreases to a value less than the second voltage level.

2. The circuit of claim 1 wherein the output means comprises a NAND-latch.

3. The circuit of claim 2 wherein the NAND-latch comprises:

a first NAND logic gate comprising:

first logic FET means having a first conductivity type channel, a drain, a source, and a gate, the source connected to the first supply means and the gate connected to the second series current path;

second logic FET means having a first conductivity type channel, a drain, a source and a gate, the source connected to the first supply means, the drain connected to the drain of the first logic FET means, and the gate connected to the first series current path;

third logic FET means having a second conductivity type channel, a drain, a source and a gate, the drain connected to the drain of the second logic FET means and the gate connected to the gate of the second logic FET means; and fourth logic FET means having a second conductivity type channel, a drain, a source and a gate, the drain connected to the source of the third logic FET means, the source connected to the second supply means and the gate connected to the gate of the first logic FET means; and second NAND logic gate comprising:

the second current mirror FET means;

fifth logic FET means having a second conductivity type channel, a drain, a source and a gate, the drain connected to the drain of the second current mirror FET means, the source connected to the drain of the second current control FET means and the gate connected to the drain of the first logic FET means; and the second current control FET means.

4. The circuit of claim 1 wherein the bias circuit means comprises:

means for providing first and second reference voltages; and first and second current source means for establishing first and second bias current flow as a function of the first and second reference voltages, respectively.

5. The circuit of claim 4 wherein:

the first current source means comprises:

first bias current FET means having a channel, a drain, a source and a gate, the gate connected to receive the first reference voltage, and the source and drain connected in a first bias current path; and second bias current FET means having a channel, a drain, a source and a gate, the gate connected to the drain and the source and drain connected in the first bias current path; and wherein the second current source means comprises:

third bias current FET means having a channel, a drain, a source and a gate, the gate connected to receive the second reference voltage, and the source and drain connected in a second bias current path; and fourth bias current FET means having a channel, a drain, a source and a gate, the gate connected to the drain and the source and drain connected in the second bias current path.

6. The circuit of claim 5 wherein:

the first bias current FET means is an enhancement mode FET means having a first conductivity type channel and its source connected to the first supply means, the first bias current FET means establishing the first bias current flow in the first bias current path as a function of the first reference voltage and a shape factor of the channel of the first bias current FET means;

the second bias current FET means is an enhancement mode FET means having a second conductivity type channel, its drain connected to the drain of the first bias current FET means and its source connected to the second supply means;

the third bias current FET means is an enhancement mode FET means having a second conductivity type channel and its source connected to the second supply means, the third bias current FET means establishing the second bias current flow in the second bias current path as a function of the second reference voltage and a shape factor of the channel of the third bias current FET means; and the fourth bias current FET means is an enhancement mode FET means having a first conductivity type channel, its drain connected to the drain of the third bias current FET means and its source connected to the first supply means.

7. The circuit of claim 4 wherein:

the first current mirror FET means is an enhancement mode FET means having a second conductivity type channel, the source connected to the second supply means, the gate connected to the gate of the second bias current FET means and the drain connected in the first series current path so that the first current flow is determined as a function of the first bias current flow and a ratio of shape factors of the channels of the second bias current FET means and the first current mirror FET means; and the first current control FET means is an enhancement mode FET means having a first conductivity type channel, the source connected to the first supply means, the drain connected in the first series current path, and wherein the first voltage level is determined by the first current flow and shape factor of the channel of the first current control FET means.

8. The circuit of claims 6 or 7 wherein:

the second current mirror FET means is an enhancement mode FET means having a first conductivity type channel, the source connected to the first supply means, the gate connected to the gate of the fourth bias current FET means and the drain connected in the second series current path so that the second current flow is determined as a function of the second bias current flow and a ratio of shape factors of the channels of the fourth bias current FET means and the second current mirror FET means; and the second current control FET means is an enhancement mode FET means having a second conductivity type channel, the source connected to the second supply means, the drain connected in the second series current path, and wherein the second voltage level is determined as a function of the second current flow and shape factor of the channel of the second current control FET means.

9. The circuit of claim 8 wherein:

the channel shape factor of the first current mirror FET means is essentially equal to the channel shape factor of the second bias current FET means so that the first current flow is essentially equal in magnitude to the first bias current flow; and the channel shape factor of the first current control FET means is essentially equal to the channel shape factor of the first bias current FET means so that the first voltage level is essentially equal in magnitude to the first reference voltage.

10. The circuit of claim 9 wherein:

the channel shape factor of the second current mirror FET means is essentially equal to the channel shape factor of the fourth bias current FET means so that the second current flow is essentially equal in magnitude to the second bias current flow; and the channel shape factor of the second current control FET means is essentially equal to the channel shape factor of the third bias current FET means so that the second voltage level is essentially equal in magnitude to the second reference voltage.

11. The circuit of claim 8 wherein the first conductivity type is P-type and the second conductivity type is N-type.

12. The circuit of claim 4 wherein the means for providing first and second reference voltages comprises a voltage divider means connected between the first and second supply means.

13. The circuit of claim 12 wherein the voltage divider means comprises a plurality of FETs each having a gate, a drain and a source, the gate and drain connected together and the source and the drain connected in a series current path between the first and second supply means.

14. An integrated circuit for comparing an input voltage signal with a voltage window defined by first and second window voltage levels, the circuit comprising:

input means for receiving an input voltage signal;

first and second supply means adapted to receive first and second supply voltage levels, respectively;

bias circuit means connected between the first and second supply means, for establishing bias current flow;

first inverter means for comparing the input voltage signal to the first window voltage level, the first inverter means connected in a first inverter current path between the first and second supply means and comprising:

first current mirror means for establishing a first inverter current in the first inverter current path, the first inverter current determined as a function of bias current flow; and first current control means for controlling flow of the first inverter current through the first inverter current path as a function of the input voltage signal, wherein the first current control means changes between a low conductivity and a high conductivity state when the first window voltage level is attained by the input voltage signal;

second inverter means for comparing the input voltage signal to the second window voltage level, the second inverter means connected in a second inverter current path between the first and second supply means and comprising:

second current mirror means for establishing a second inverter current in the second inverter current path, the second inverter current determined as a function of bias current flow;

second current control means for controlling flow of the second inverter current through the second inverter current path as a function of the input voltage signal, wherein the second current control means changes between a low conductivity and a high conductivity state when the second window voltage level is attained by the input voltage signal; and output means for providing an output signal indicative of the relationship of the input voltage signal to the voltage window as a function of a previous output signal.

15. The circuit of claim 14 wherein the bias circuit means comprises:

means for providing first and second reference voltages;

first current source means for establishing a first bias current flow in a first bias current path between the first and second supply means as a function of the first reference voltage; and second current source means for establishing a second bias current flow in a second bias current path between the first and second supply means as a function of the second reference voltage.

16. The circuit of claim 15 wherein the first current source means comprises:

first bias current means having a drain, a source, a gate and a channel, the drain and source connected in the first bias current path and the gate connected to receive the first reference voltage, the first bias current means establishing the first bias current flow as a function of the first reference voltage and a channel shape factor of the first bias current means; and second bias current means having a drain, a source, a gate and a channel, the drain and source connected in the first bias current path and the gate connected to the drain; and wherein the second current source means comprises:

third bias current means having a drain, a source, a gate and a channel, the drain and source connected in the second bias current path and the gate connected to receive the second reference voltage, the third bias current means establishing the second bias current flow as a function of the second reference voltage and a channel shape factor of the third bias current means; and fourth bias current means having a drain, a source, a gate and a channel, the drain and source connected in the second bias current path and the gate connected to the drain.

17. The circuit of claim 14 wherein:

the first current mirror means has a drain, a source, a gate and a channel, the drain and source connected in the first inverter current path and the gate connected to the first current source means so that the first inverter current is determied as a function of the first bias current flow and a ratio of shape factors of the channels of the second bias current means and the first current mirror means;

the first current control means has a drain, a source, a gate and a channel, the drain and source connected in the first inverter current path and the gate connected to the input means to receive the input voltage signal so that the first current control means changes between a low conductivity and a high conductivity state when the input voltage signal attains the first window voltage level, and wherein the first window voltage level is determined as a function of the first inverter current and channel shape factor of the first current control means;

the second current mirror means has a drain, a source, a gate and a channel, the drain and source connected in the second inverter current path and the gate connected to the second current source means so that the second inverter current is determined as a function of the second bias current flow and a ratio of shape factors of the channels of the fourth bias current means and the second current mirror means; and the second current control means has a drain, a source, a gate and a channel, the drain and source connected in the second inverter current path, and the gate connected to the input means to receive the input voltage signal so that the second current control means changes between a low conductivity and a high conductivity state when the input voltage signal attains the second window voltage level, and wherein the second window voltage level is determined as a function of the second inverter current and channel shape factor of the second current control means.

18. The circuit of claim 16 wherein:

the first bias current means is an enhancement mode FET means having a first conductivity type channel, the source connected to the first supply means and the drain connected in the first bias current path;

the second bias current means is an enhancement mode FET means having a second conductivity type channel, the drain connected to the drain of the first bias current FET means and the source connected to the second supply means;

the third bias current means is an enhancement mode FET means having a second conductivity type channel, the source connected to the second supply means and the drain connected in the second bias current path; and the fourth bias current means is an enhancement mode FET means having a first conductivity type channel, the drain connected to the drain of the third bias current FET means and the source connected to the first supply means.

19. The circuit of claim 18 wherein:

the first current mirror means is an enhancement mode FET means having a second conductivity type channel, the source connected to the second supply means, the gate connected to the gate of the second bias current FET means and the drain connected in the first inverter current path;

the first current control means is an enhancement mode FET means having a first conductivity type channel, its source connected to the first supply means and its drain connected in the first inverter current path.

20. The circuit of claims 18 or 19 wherein:

the second current mirror means is an enhancement mode FET means having a first conductivity type channel, the source connected to the first supply means, the gate connected to the gate of the fourth bias current FET means and the drain connected in the second inverter current path; and the second current control means is an enhancement mode FET means having a second conductivity type channel, its source connected to the second supply means and its drain connected in the second inverter current path.

21. The circuit of claim 14 wherein the output means is connected to the first and second inverter current paths and provides a digital output signal exhibiting hysteresis with respect to the input voltage signal, the digital output signal indicating whether the input voltage is presently within or outside the voltage window as a function of a previous digital output signal.

22. The circuit of claim 21 wherein the digital output signal switches from a first state to a second state if the digital output signal was previously in the first state and the input voltage signal increases to a level greater than the first window voltage level, and switches from the second state to the first state if the digital output signal was previously in the second state and the input voltage signal decreases to a level less than the second window voltage level.

23. The circuit of claim 22 wherein the output means for providing the digital output signal comprises a NAND-latch connected to the first and second inverter means.

24. The circuit of claim 23 wherein the NAND-latch comprises:
a first NAND logic gate comprising:
first logic FET means having a first conductivity type channel, a drain, a source, and a gate, the source connected to the first supply means and the gate connected to the second series current path;
second logic FET means having a first conductivity type channel, a drain, a source and a gate, the source connected to the first supply means, the drain connected to the drain of the first logic FET means, and the gate connected to the first series current path;
third logic FET means having a second conductivity type channel, a drain, a source and a gate, the drain connected to the drain of the second logic FET means and the gate connected to the gate of the second logic FET means; and
fourth logic FET means having a second conductivity type channel, a drain, a source and a gate, the drain connected to the source of the third logic FET means, the source connected to the second supply means and the gate connected to the gate of the first logic FET means;
a second NAND logic gate comprising:
the second current mirror FET means;
fifth logic FET means having a second conductivity type channel, a drain, a source and a gate, the drain connected to the drain of the second current mirror FET means, the source connected to the drain of the second current control FET means and the gate connected to the drain of the first logic FET means; and
the second current control FET means.

25. The circuit of claim 23 wherein:
the channel shape factor of the second current mirror FET means is equal to the channel shape factor of the fourth bias current FET means so that the second current flow is equal in magnitude to the second bias current flow; and
the channel shape factor of the second current control FET means is equal to the channel shape factor of the third bias current FET means so that the second voltage level is equal in magnitude to the second reference voltage.

26. The circuit of claim 20 wherein:
the channel shape factor of the first current mirror FET means is equal to the channel shape factor of the second bias current FET means so that the first current flow is equal in magnitude to the first bias current flow; and
the channel shape factor of the first current control FET means is equal to the channel shape factor of the first bias current FET means so that the first window voltage level is equal in magnitude to the first reference voltage.

27. The circuit of claim 15 wherein the means for providing the first and second reference voltages comprises a voltage divider means connected between the first and second supply means.

28. The circuit of claim 27 wherein the voltage divider means comprises a plurality of FETs each having a gate, a drain and a source, the gate and drain connected together and the source and the drain connected in a series current path between the first and second supply means.

29. A field effect transistor (FET) integrated circuit for comparing an input voltage signal with two reference voltage levels representing a voltage window and providing an output indicating the relationship of the input voltage signal to the voltage window, the circuit comprising:
first and second supply means adapted to receive first and second supply voltage levels, respectively;
input means for receiving the input voltage signal;
voltage divider means for providing first and second reference voltages;
first bias means for establishing a first bias current flow in a first bias current path, the first bias means comprising a first enhancement mode FET means having a first conductivity type channel, a drain, a source, and a gate, the source connected to the first supply means, the drain connected in the first bias current path and the gate connected to receive the first reference voltage so that the first bias current flow is established as a function of the first reference voltage and the channel shape factor of the first FET means;
first current mirror means for establishing a first inverter current flow in a first inverter current path, the first current mirror means comprising:
second enhancement mode FET means having a second conductivity type channel, a drain, a source, and a gate, the drain and gate connected to the drain of the first FET means and the source connected to the second supply means; and
third enhancement mode FET means having a second conductivity type channel, a drain, a source and a gate, the source connected to the second supply means, the drain connected in the first inverter current path, the gate connected to the gate of the second FET means and the channel having a same shape factor as the channel of the second FET means so that the first inverter current flow established in the first inverter current path is essentially equal in magnitude to the first bias current flow in the first bias current path;

first current control means for controlling the first inverter current flow in the first inverter current path, the first current control means comprising a fourth enhancement mode FET means having a first conductivity type channel, a drain, a source and a gate, the source connected to the first supply means, the drain connected to the drain of the third FET means, the gate connected to receive the input voltage signal and the channel having a shape factor essentially equal to the shape factor of the channel of the first FET means so that the first current control means changes from a low conductivity to a high conductivity state when the input voltage signal attains the first reference voltage level;

second bias means for establishing a second bias current flow in a second bias current path, the second bias means comprising a fifth enhancement mode FET means having a second conductivity type channel, a drain, a source and a gate, the source connected to the second supply means, the drain connected in the second bias current path and the gate connected to receive a second reference voltage so that the second bias current flow is established as a function of the second reference voltage and the channel shape factor of the fifth FET means;

second current mirror means for establishing a second inverter current flow in a second inverter current path, the second current mirror means comprising:

sixth enhancement mode FET means having a first conductivity type channel, a drain, a source and a gate, the drain and gate connected to the drain of the fifth FET means and the source connected to the first supply means; and seventh enhancement mode FET means having a first conductivity type channel, a drain, a source, and a gate, the source connected to the first supply means, the drain connected in the second inverter current path, the gate connected to the gate of the sixth FET means and the channel having a shape factor essentially equal to the shape factor of the channel of the sixth FET means so that the second inverter current flow established in the second inverter current path is essentially equal in magnitude to the second bias current flow in the second bias current path;

second current control means for controlling the second inverter current flow in the second inverter current path, the second current control means comprising an eighth enhancement mode FET means having a second conductivity type channel, a drain, a source and a gate, the source connected to the second supply means, the drain connected in the second inverter current path, the gate connected to receive the input voltage signal and the channel having a shape factor essentially equal to the shape factor of the channel of the fifth FET means so that the second current control means changes from a low conductivity to a high conductivity state when the input voltage signal attains the second reference voltage level; and output means connected in the first and second inverter current paths, the output means providing an output indicative of the relationship of the input voltage signal to the voltage window.

30. The circuit of claim 29 wherein the output is a digital output signal being in a first state if the digital output signal was previously in the first state and the input voltage signal is less than the first reference voltage level, and being in a second state if the digital output signal was previously in the second state and the input voltage signal is greater than the second reference voltage level, the digital output signal switching from the first state to the second state when the input voltage signal increases to a level greater than the first reference voltage level, and switching from the second to the first state when the input voltage signal decreases to a level less than the second reference voltage level.

31. The circuit of claim 30 wheren the output means comprises:

ninth enhancement mode FET means having a second conductivity type channel, a drain, a source and a gate, the drain connected to the drain of the seventh FET means, the source connected to the drain of the eighth FET means, and the gate connected to the output means;

tenth enhancement mode FET means having a first conductivity type channel, a drain, a source and a gate, the source connected to the first supply means, the gate connected to the drain of the seventh FET means and the drain connected to the gate of the ninth FET means;

eleventh enhancement mode FET means having a first conductivity type channel, a drain, a source and a gate, the drain connected to the drain of the tenth FET means, the source connected to the first supply means and the gate connected to the drain of the fourth FET means;

twelfth enhancement mode FET means having a second conductivity type channel, a drain, a source and a gate, the drain connected to the drain of the eleventh FET means and the gate connected to the gate of the eleventh FET means; and thirteenth enhancement mode FET means having a second conductivity type channel, a drain, a source and a gate, the drain connected to the source of the twelfth FET means, the source connected to the second supply means and the gate connected to the drain of the seventh FET means.

32. The circuit of claim 29 wherein the voltage divider means for providing a plurality of reference voltages comprises a plurality of enhancement mode FETs each having a drain, a source and a gate, the gate and drain connected together and the source and the drain connected in a series current path between the first and second supply means.

33. The circuit of claim 32 wherein the voltage divider is comprised of three FETs so that the first reference voltage is equal to two-thirds of the difference between the first and second supply voltages and the second reference voltage is equal to one-third of the difference between the first and second supply voltages.

34. A field effect transistor (FET) integrated circuit for comparing an input voltage signal with two voltage levels representing a desired voltage window and providing a digital output signal indicating the relationship of the input voltage signal to the voltage window as a function of a previous digital output signal, the circuit comprising:

first and second supply means adapted to receive first and second supply voltage levels, respectively;

input means for receiving an input voltage signal;

voltage divider means for providing first and second reference voltages;

first enhancement mode FET means having a first conductivity type channel, a drain, a source and a gate, the source connected to the first supply means and the gate connected to receive the first reference voltage;

second enhancement mode FET means having a second conductivity type channel, a drain, a source and a gate, the drain and gate connected to the drain of the first FET means and the source connected to the second supply means;

third enhancement mode FET means having a second conductivity type channel, a drain, a source and a gate, the gate connected to the gate of the second FET means and the source connected to the second supply means;

fourth enhancement mode FET means having a first conductivity type channel, a drain, a source and a gate, the drain connected to the drain of the third FET means, the source connected to the first supply means and the gate connected to receive the input voltage signal;

fifth enhancement mode FET means having a second conductivity type channel, a drain, a source and a gate, the source connected to the second supply means and the gate connected to receive the second reference voltage;

sixth enhancement mode FET means having a first conductivity type channel, a drain, a source and a gate, the drain and gate connected to the drain of the fifth FET means and the source connected to the first supply means;

seventh enhancement mode FET means having a first conductivity type channel, a drain, a source and a gate, the source connected to the first supply means and the gate connected to the gate of the sixth FET means;

eighth enhancement mode FET means having a second conductivity type channel, a drain, a source and a gate, the source connected to the second supply means and the gate connected to receive the input voltage signal; and output means connected between the drains of the third and fourth FET means and the drains of the seventh and eighth FET means, the output means providing a digital output signal which switches from a first state to a second state when the input voltage signal increases to a value greater than the first reference voltage level and switches from the second state to the first state when the input voltage signal decreases to a value less than the second reference voltage level.

35. The circuit of claim 34 wherein the output means comprises:

ninth enhancement mode FET means having a second conductivity type channel, a drain, a source and a gate, the drain connected to the drain of the seventh FET means and the source connected to the drain of the eighth FET means;

tenth enhancement mode FET means having a first conductivity type channel, a drain, a source and a gate, the drain connected to the gate of the ninth FET means, the source connected to the first supply means and the gate connected to the drain of the seventh FET means;

eleventh enhancement mode FET means having a first conductivity type channel, a drain, a source and a gate, the drain connected to the drain of the tenth FET means, the source connected to the first supply means and the gate connected to the drain of the fourth FET means;

twelfth enhancement mode FET means having a second conductivity type channel, a drain, a source and a gate, the drain connected to the drain of the eleventh FET means and the gate connected to the gate of the eleventh FET means; and thirteenth enhancement mode FET means having a second conductivity type channel, a drain, a source and a gate, the drain connected to the source of the twelfth FET means, the source connected to the second supply means and the gate connected to the drain of the ninth FET means.

36. The circuit of claim 34 wherein the voltage divider means for providing the first and second reference voltages comprises a plurality of enhancement mode FETs each having a drain, a source and a gate, the gate and drain connected together and the source and the drain connected in a series current path between the first and second supply means.

37. The circuit of claim 36 wherein the voltage divider is comprised of three FETs so that the first reference voltage is equal to two-thirds of the difference between the first and second supply voltages and the second reference voltage is equal to one-third of the difference between the first and second supply voltages.

38. The circuit of claim 34 wherein the first and fourth FET means have essentially identical channel shape factors, the second and third FET means have essentially identical channel shape factors, the fifth and eighth FET means have essentially identical channel sizes and the sixth and seventh FET means have essentially identical shape factors.

39. An integrated circuit for comparing an input voltage signal with a voltage window defined by first and second window voltage levels, the circuit comprising:

input means for receiving an input voltage signal;

first and second supply means adapted to receive first and second supply voltage levels, respectively;

means for providing first and second reference voltages;

first current source means for establishing a first bias current flow in a first bias current path between the first and second supply means as a function of the first reference voltage;

second current source means for establishing a second bias current flow in a second bias current path between the first and second supply means as a function of the second reference voltage;

first inverter means for comparing the input voltage signal to the first window voltage level, the first inverter means connected in a first inverter current path between the first and second supply means and comprising:

first current mirror means connected to the first current source means for establishing a first inverter current in the first inverter current path, the first inverter current determined as a function of the first bias current; and first current control means for controlling flow of the first inverter current through the first inverter current path as a function of the input voltage signal, wherein the first current control means changes between a low conductivity and a high conductivity state when the first window voltage level is attained by the input voltage signal;

second inverter means for comparing the input voltage signal to the second window voltage level, the second inverter means connected in a second inverter current path between the first and second supply means and comprising:

second current mirror means connected to the second current source means for establishing a second inverter current in the second inverter current path, the second inverter current determined as a function of the second bias current;

second current control means for controlling flow of the second inverter current through the second inverter current path as a function of the input voltage signal, wherein the second current control means changes between a low conductivity and a high conductivity state when the second window voltage level is attained by the input voltage signal; and output means connected to the first and second inverter means for providing an output indicative of the relationship of the input voltage signal to the voltage window.

40. The circuit of claim 29 wherein the first current source means comprises:

first bias current means having a drain, a source, a gate and a channel, the drain and source connected in the first bias current path and the gate connected to receive the first reference voltage, the first bias current means establishing the first bias current flow as a function of the first reference voltage and a channel shape factor of the first bias current means; and second bias current means having a drain, a source, a gate and a channel, the drain and source connected in the first bias current path and the gate connected to the drain; and wherein the second current source means comprises:

third bias current means having a drain, a source, a gate and a channel, the drain and source connected in the second bias current path and the gate connected to receive the second reference voltage, the third bias current means establishing the second bias current flow as a function of the second reference voltage and a channel shape factor of the third bias current means; and fourth bias current means having a drain, a source, a gate and a channel, the drain and source connected in the second bias current path and the gate connected to the drain.

41. The circuit of claim 40 wherein:

the first current mirror means has a drain, a source, a gate and a channel, the drain and source connected in the first inverter current path and the gate connected to the first current source means so that the first inverter current is determied as a function of the first bias current flow and a ratio of shape factors of the channels of the second bias current means and the first current mirror means;

the first current control means has a drain, a source, a gate and a channel, the drain and source connected in the first inverter current path and the gate connected to the input means to receive the input voltage signal so that the first current control means changes between a low conductivity and a high conductivity state when the input voltage signal attains the first window voltage level, and wherein the first window voltage level is determined as a function of the first inverter current and channel shape factor of the first current control means;

the second current mirror means has a drain, a source, a gate and a channel, the drain and source connected in the second inverter current path and the gate connected to the second current source means so that the second inverter current is determined as a function of the second bias current flow and a ratio of shape factors of the channels of the fourth bias current means and the second current mirror means; and the second current control means has a drain, a source, a gate and a channel, the drain and source connected in the second inverter current path, and the gate connected to the input means to receive the input voltage signal so that the second current control means changes between a low conductivity and a high conductivity state when the input voltage signal attains the second window voltage level, and wherein the second window voltage level is determined as a function of the second inverter current and channel shape factor of the second current control means.

42. The circuit of claim 41 wherein:

the first bias current means is an enhancement mode FET means having a first conductivity type channel, the source connected to the first supply means and the drain connected in the first bias current path;

the second bias current means is an enhancement mode FET means having a second conductivity type channel, the drain connected to the drain of the first bias current FET means and the source connected to the second supply means;

the third bias current means is an enhancement mode FET means having a second conductivity type channel, the source connected to the second supply means and the drain connected in the second bias current path; and the fourth bias current means is an enhancement mode FET means having a first conductivity type channel, the drain connected to the drain of the third bias current FET means and the source connected to the first supply means.

43. The circuit of claim 42 wherein:

the first current mirror means is an enhancement mode FET means having a second conductivity type channel, the source connected to the second supply means, the gate connected to the gate of the second bias current FET means and the drain connected in the first inverter current path;

the first current control means is an enhancement mode FET means having a first conductivity type channel, its source connected to the first supply means and its drain connected in the first inverter current path.

44. The circuit of claims 42 or 43 wherein:

the second current mirror means is an enhancement mode FET means having a first conductivity type channel, the source connected to the first supply means, the gate connected to the gate of the fourth bias current FET means and the drain connected in the second inverter current path; and the second current control means is an enhancement mode FET means having a second conductivity type channel, its source connected to the second supply means and its drain connected in the second inverter current path.

45. The circuit of claim 44 wherein:

the channel shape factor of the first current mirror FET means is equal to the channel shape factor of the second bias current FET means so that the first current flow is equal in magnitude to the first bias current flow; and the channel shape factor of the first current control FET means is equal to the channel shape factor of the first bias current FET means so that the first window voltage level is equal in magnitude to the first reference voltage.

46. The circuit of claim 45 wherein:

the channel shape factor of the second current mirror FET means is equal to the channel shape factor of the fourth bias current FET means so that the second current flow is equal in magnitude to the second bias current flow; and the channel shape factor of the second current control FET means is equal to the channel shape factor of the third bias current FET means so that the second voltage level is equal in magnitude to the second reference voltage.

47. The circuit of claim 39 wherein the output means is connected to the first and second inverter current paths and provides a digital output signal exhibiting hysteresis with respect to the input voltage signal, the digital output signal indicating whether the input voltage is presently within or outside the voltage window as a function of a previous digital output signal.

48. The circuit of claim 47 wherein the digital output signal switches from a first state to a second state if the digital output signal was previously in the first state and the input voltage signal increases to a level greater than the first window voltage level, and switches from the second state to the first state if the digital output signal was previously in the second state and the input voltage signal decreases to a level less than the second window voltage level.

49. The circuit of claim 48 wherein the output means comprises:

a first NAND logic gate comprising:

first logic FET means having a first conductivity type channel, a drain, a source, and a gate, the source connected to the first supply means and the gate connected to the second series current path;

second logic FET means having a first conductivity type channel, a drain, a source and a gate, the source connected to the first supply means, the drain connected to the drain of the first logic FET means, and the gate connected to the first series current path;

third logic FET means having a second conductivity type channel, a drain, a source and a gate, the drain connected to the drain of the second logic FET means and the gate connected to the gate of the second logic FET means; and fourth logic FET means having a second conductivity type channel, a drain, a source and a gate, the drain connected to the source of the third logic FET means, the source connected to the second supply means and the gate connected to the gate of the first logic FET means;

a second NAND logic gate comprising:

the second current mirror FET means;

fifth logic FET means having a second conductivity type channel, a drain, a source and a gate, the drain connected to the drain of the second current mirror FET means, the source connected to the drain of the second current control FET means and the gate connected to the drain of the first logic FET means; and the second current control FET means.

* * * * *